United States Patent
Yang et al.

(10) Patent No.: US 10,608,127 B2
(45) Date of Patent: Mar. 31, 2020

(54) METHOD FOR MANUFACTURING CATHODE OF SOLAR UNIT

(71) Applicant: BOE Technology Group Co., Ltd., Beijing (CN)

(72) Inventors: Jiuxia Yang, Beijing (CN); Jiantao Liu, Beijing (CN); Xuebo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 103 days.

(21) Appl. No.: 15/711,328

(22) Filed: Sep. 21, 2017

(65) Prior Publication Data

US 2018/0083148 A1 Mar. 22, 2018

(30) Foreign Application Priority Data

Sep. 22, 2016 (CN) .......................... 2016 1 0844422

(51) Int. Cl.
*H01L 21/00* (2006.01)
*H01L 31/0224* (2006.01)
(Continued)

(52) U.S. Cl.
CPC .... *H01L 31/022425* (2013.01); *H01L 31/073* (2013.01); *H01L 31/18* (2013.01); *Y02E 10/543* (2013.01)

(58) Field of Classification Search
CPC .............................................. H01L 31/022425
(Continued)

(56) References Cited

U.S. PATENT DOCUMENTS

| 2011/0217544 A1* | 9/2011 | Young | B29C 37/0032 |
| | | | 428/327 |
| 2011/0281070 A1* | 11/2011 | Mittal | H01L 31/022466 |
| | | | 428/142 |

(Continued)

FOREIGN PATENT DOCUMENTS

| CN | 104335044 A | 2/2015 |
| CN | 104779380 A | 7/2015 |
| CN | 106384566 A | 2/2017 |

OTHER PUBLICATIONS

Chinese Office Action for Chinese Application No. 201610844422.6 dated Jun. 2, 2017.
(Continued)

*Primary Examiner* — Caleb E Henry
(74) *Attorney, Agent, or Firm* — Fay Sharpe LLP

(57) ABSTRACT

A cathode of a solar unit and method for manufacturing thereof, and a solar cell. The method for manufacturing a cathode of a solar unit includes the following steps: step a) curing a composition to form a film, and the composition comprises conducting polymer, curing material, ionic liquid and phosphorene; step b) applying photoresist on the film corresponding to pixel areas by ink jet printing or applying photoresist on the film corresponding to pixel areas by coating, and then carrying out the processes of exposure and development; step c) etching the film on which the photoresist has been ink jet printed or coated to form the cathode pattern of the solar unit; step d) peeling off the photoresist to obtain the cathode of the solar unit. A cathode of a solar unit that has high stability, good flexibility, low resistance value and long cell duration can be manufactured by using the method for manufacturing a cathode of a solar unit.

14 Claims, 2 Drawing Sheets

(51) Int. Cl.
*H01L 31/073* (2012.01)
*H01L 31/18* (2006.01)

(58) Field of Classification Search
USPC .......................................................... 438/58
See application file for complete search history.

(56) References Cited

U.S. PATENT DOCUMENTS

| | | | | |
|---|---|---|---|---|
| 2012/0270054 A1* | 10/2012 | Hong | ...................... | B29B 15/08 |
| | | | | 428/408 |
| 2013/0000952 A1* | 1/2013 | Srinivas | ................... | H01B 1/02 |
| | | | | 174/126.1 |
| 2013/0056244 A1* | 3/2013 | Srinivas | ................. | G06F 3/041 |
| | | | | 174/250 |
| 2013/0271090 A1* | 10/2013 | Hunter | ................... | H01G 11/38 |
| | | | | 320/167 |
| 2014/0295179 A1* | 10/2014 | Naito | ..................... | B82Y 10/00 |
| | | | | 428/339 |
| 2014/0313636 A1* | 10/2014 | Tour | ...................... | H01G 11/72 |
| | | | | 361/502 |
| 2015/0064628 A1* | 3/2015 | Guo | ......................... | G03F 7/30 |
| | | | | 430/316 |
| 2015/0371848 A1* | 12/2015 | Zaretski | ............ | H01L 21/02527 |
| | | | | 438/496 |
| 2016/0004298 A1* | 1/2016 | Mazed | .................... | G06F 3/011 |
| | | | | 345/633 |
| 2016/0056301 A1 | 2/2016 | Lee | | |
| 2016/0338206 A1* | 11/2016 | Yang | ..................... | H05K 3/027 |

OTHER PUBLICATIONS

Chinese Office Action for Chinese Application No. 201610844422.6 dated Jul. 18, 2017.

* cited by examiner

METHOD FOR MANUFACTURING CATHODE OF SOLAR UNIT

The application claims the priority to a Chinese patent application which is filed to the China State Intellectual Property Office on Sep. 22, 2016, which title is "cathode and method for manufacturing thereof, solar unit, composition and film", and which application number is 201610844422.6, and the content of the Chinese patent application is combined into the present disclosure in whole.

FIELD

The disclosure relates to the technical field of pixel electrodes, especially relates to cathode of solar unit and method for manufacturing thereof, and solar cell.

BACKGROUND

With the development and the popularization of wearable devices, instruction set of wearable devices is booming, and the number of instruction is also increasing remarkably. However, as the application function of wearable devices increases, the duration capability of solar cell does not keep pace with the diversification and complication of application. Therefore, a solar cell for the wearable devices with elevated duration capability is demanded urgently. One of the critical factors for duration capability of solar cell is the stability of cathode of a solar cell unit (also called solar unit in the following passages).

Therefore, it is desired to provide a cathode of solar unit with high stability.

SUMMARY

Disclosed are cathode of solar unit and method for manufacturing thereof. A cathode of solar unit with high stability can be manufactured by using the method for manufacturing cathode of solar unit provided in the present disclosure.

Specifically, technical solutions are as follows:

In a first aspect, the disclosure provides a method for manufacturing a cathode of a solar unit, which comprises the following steps, step a) curing a composition to form a film, and the composition comprises conducting polymer, curing material, ionic liquid and phosphorene;

step b) applying photoresist on the film corresponding to pixel areas by ink jet printing, or applying photoresist on the film corresponding to pixel areas by coating, then carrying out the processes of exposure and development;

step c) etching the film on which the photoresist has been ink jet printed or coated to form the cathode pattern of the solar unit; and step d) peeling off the photoresist to obtain the cathode of the solar unit.

To be specific, the weight ratio of the phosphorene to the sum of the conducting polymer, the curing material and the ionic liquid can be about 2%~10%.

To be specific, the conducting polymer can comprise at least one of the polymers selected from the group of: poly(sodium-p-styrenesulfonate), poly(p-phenylenevinylene), polythiophene polymer, polysiloxane polymer, triphenylmethane polymer, triarylamine polymer and pyrazoline polymer.

To be specific, the ionic liquid can comprise water and at least one of the salt selected from the group of: 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate and 1-butyl-3-methylimidazolium chloride; the mass fraction of the at least one of the salts is about 10%~99% with respect to the total mass of the ionic liquid. As used herein the symbol "~" refers to "to about". Accordingly, when the expression "~" is used with reference to a numeric range, it indicates a range from about X "to about Y".

To be specific, the mass fraction of the conducting polymer can be about 5%~10% with respect to the total mass of the conducting polymer, the curing material and the ionic liquid.

To be specific, the mass fraction of the curing material is about 0.5%~5% with respect to the total mass of the conducting polymer, the curing material and the ionic liquid.

Preferably, the composition can further comprise:

wetting leveling agent whose mass fraction is about 0.001%~1% with respect to the total mass of the conducting polymer, the curing material and the ionic liquid; and/or adhesion promoter whose mass fraction is about 0.001%~1% with respect to the total mass of the conducting polymer, the curing material and the ionic liquid.

In a second aspect, the disclosure provides another method for manufacturing a cathode of a solar unit, comprising the following steps, step a) mixing a first curing material, a first ionic liquid and phosphorene homogeneously to obtain a first mixture;

step b) coating the first mixture on the substrate, and then curing it to form a first film layer;

step c) applying photoresist on the first film layer corresponding to pixel areas by ink jet printing or applying photoresist on the first film layer corresponding to pixel areas by coating, and then carrying out the processes of exposure and development;

step d) etching the first film layer on which the photoresist has been ink jet printed or coated to form the cathode pattern of the solar unit;

step e) peeling off the photoresist;

step f) spraying the cathode pattern of the solar unit by using a second mixture comprising a first conducting polymer, a second curing material and a second ionic liquid, or immersing the cathode pattern of the solar unit in the second mixture;

step g) heating and curing it to form the cathode of the solar unit.

To be specific, the first curing material can be the same as or be different from the second curing material.

To be specific, the first curing material and the second curing material can comprise polymerisable resin and curing agent, respectively.

To be specific, the polymerisable resin can be at least one of unsaturated polyester resin, phenolic resin and epoxy resin.

To be specific, the curing agent can be aliphatic amine curing agent or aromatic amine curing agent.

To be specific, the first ionic liquid can be the same as or be different from the second ionic liquid To be specific, the first ionic liquid and the second ionic liquid can respectively comprise water and at least one of the salt selected from the group of: 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate and 1-butyl-3-methylimidazolium chloride.

To be specific, the first conducting polymer can comprise at least one of the polymers selected from the group of: poly(sodium styrenesulfonate), poly(p-phenylenevinylene), polythiophene polymer, polysiloxane polymer, triphenylmethane polymer, triarylamine polymer and pyrazoline polymer.

In a third aspect, the disclosure provides further another method for manufacturing a cathode of a solar unit, which comprises the following steps, step a) mixing a third curing material, a third ionic liquid and phosphorene homogeneously, to obtain a third mixture;

step b) coating the third mixture on the substrate, and then curing it to form a second film layer;

step c) spraying the second film layer by using a fourth mixture comprising a second conducting polymer, a fourth curing material and a fourth ionic liquid, or immersing the second film layer in the fourth mixture;

step d) heating and curing it to form a third film layer;

step e) applying photoresist on the third film corresponding to pixel areas by ink jet printing or applying photoresist on the third film corresponding to pixel areas by coating, and then carrying out the processes of exposure and development;

step f) etching the third film on which the photoresist has been ink jet printed or coated to form the cathode pattern of the solar unit;

step g) peeling off the photoresist to obtain the cathode of the solar unit.

In a fourth aspect, the disclosure provides a cathode of a solar unit, which is manufactured by the method for manufacturing a cathode of a solar unit according to any one of the first to third aspect.

In a fifth aspect, the disclosure provides a solar unit, which comprises a cathode, an anode, and a p-i-n layer located between the cathode and the anode, wherein the cathode is that described according to the fourth aspect.

In a sixth aspect, the disclosure provides a display device integrated with a solar unit, the solar unit of the display device is that described according to the fifth aspect.

In a seventh aspect, the disclosure provides a composition for manufacturing the cathode of the solar unit, which is the composition used in the first aspect.

In an eighth aspect, the disclosure provides a film, which is the film formed in the step a) of the first aspect or third film formed in the step d) of the third aspect.

In a ninth aspect, the disclosure provides a cathode of solar unit, comprising:

a film which is formed by curing a composition, and a pixel electrode which is formed on the film;

wherein the composition comprises conducting polymer, curing material, ionic liquid and phosphorene.

To be specific, the weight ratio of the phosphorene to the sum of the conducting polymer, the curing material and the ionic liquid can be about 2%~10%.

To be specific, the conducting polymer can comprise at least one of the polymers selected from the group of: poly(sodium styrenesulfonate), poly(p-phenylenevinylene), polythiophene polymer, polysiloxane polymer, triphenylmethane polymer, triarylamine polymer and pyrazoline polymer.

To be specific, the mass fraction of the conducting polymer can be 5%~10% with respect to the total mass of the conducting polymer, the curing material and the ionic liquid.

In a tenth aspect, the disclosure provides cathode of a solar cell, comprising an above mentioned cathode of solar unit.

The technical effects in the embodiments of the disclosure lie in that a cathode of a solar unit that has high stability, good flexibility, low resistance value and long cell duration can be manufactured by using the method for manufacturing a cathode of a solar unit.

BRIEF DESCRIPTION OF THE DRAWINGS

Brief description will be given below to the accompanying drawings of the embodiments to provide a more clear understanding of the technical solutions of the embodiments of the disclosure. Obviously, the drawings described below only involve partial embodiments of the disclosure, and it will be apparent to those skilled in the art that other drawings can be obtained from these drawings with no creative efforts.

Numerals in the accompanying drawings are.

Figure 1:
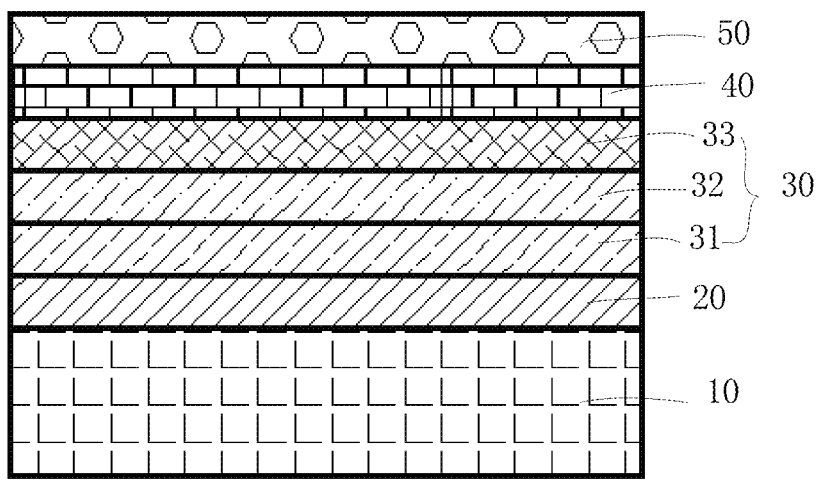
FIG. 1 is a schematic structural view of a device integrated with a solar unit provided by the embodiment of the disclosure.

10. substrate; 20. cathode; 30. p-i-n layer; 31. n-type semiconductor layer; 32. i intrinsic semiconductor layer; 33. p-type semiconductor layer; 40. anode; 50. protective layer.

DETAILED DESCRIPTION OF THE EMBODIMENTS

For more clear understanding of the technical solutions and advantages of the embodiments of the disclosure, detailed description will be given below to the embodiments of the disclosure.

In a first aspect, the disclosure provides a method for manufacturing a cathode of a solar unit, comprising the following steps, step a) curing a composition to form a film, and the composition comprises conducting polymer, curing material, ionic liquid and phosphorene;

step b) applying photoresist on the film corresponding to pixel areas by ink jet printing or applying photoresist on the film corresponding to pixel areas by coating, and then carrying out the processes of exposure and development;

step c) etching the film on which the photoresist has been ink jet printed or coated to form the cathode pattern of the solar unit;

step d) peeling off the photoresist to obtain the cathode of the solar unit.

According to the method for manufacturing a cathode of a solar unit, the material of phosphorene is mixed with conducting polymer, curing material and ionic liquid to form a composition, and then the composition is cured into a film, so as that the phosphorene can be isolated with water and gas without chemical reaction. This creates far higher stability, transmittance and carrier transfer rate of the composition than those of the phosphorene, and the original advantages of the phosphorene such as high mechanical strength and good flexibility are maintained. The cathode of the solar unit manufactured by the method for manufacturing a cathode of a solar unit has properties of high stability, low resistance value and long cell duration. In other words, phosphorene is mixed with conducting polymer, curing material and ionic liquid to form a composition in the method for manufacturing a cathode of a solar unit. The phosphorene is wrapped by conducting polymer, curing material and ionic liquid, so as that the phosphorene can be isolated with water and air. Then, in this state the composition is cured to form a film, which makes the phosphorene not react with gas or air, and finally obtains a cathode with far higher stability, transmittance and carrier transfer rate than those of the phosphorene exposed in water or air, and the original advantages of the phosphorene such as high mechanical strength and good flexibility are maintained.

It should be appreciated for those skilled in the art that it is required to carry out the method for manufacturing the cathode of the solar unit in the relatively vacuum and clean environment.

Further, the preparation of the composition in step a) can be that mixing the ionic liquid and the curing material firstly, and heating the mixture at low temperature (usually about 45~60° C.) and making them homogeneous, after the curing material being completely dissolved, cooling the mixture to the room temperature, then adding the conducting polymer into the mixture and mixing them homogeneously, then adding the phosphorene into the mixture and mixing them homogeneously, and finally the composition being prepared. The way of mixing can be shaking or stirring, and the stirring speed can be 50~300 r/min. When the phosphorene is mixing, the stirring time can be 18~36 h, so as that the phosphorene can be dispersed into the mixture formed by the conducting polymer, the curing material and the ionic liquid.

Additionally, as for curing the composition to form the film in step a), it can be that firstly coating the composition on the substrate, and then cooling the composition to the room temperature (usually about 25±3° C.) for about 10~30 min, finally the composition being cured to form the film, wherein the substrate can be a polyimide substrate, the method of the coating can be the rotatory coating method or the slit coating method in combination with the rotatory coating method.

Besides, as for applying photoresist on the film corresponding to pixel areas by ink jet printing or applying photoresist on the film by coating and then carrying out the processes of exposure and development in step b), it can be preferably that applying photoresist on the film corresponding to pixel areas by ink jet printing so as to reduce the pollution to the phosphorene, because the phosphorene is a kind of nano-scale material.

In one embodiment of the disclosure, the weight ratio of the phosphorene to the sum of the conducting polymer, the curing material and the ionic liquid is about 2%~10%, preferably about 6%.

In another embodiment of the disclosure, the conducting polymer can comprise at least one of the polymers selected from the group of:
poly(sodium-p-styrenesulfonate), poly(p-phenylenevinylene), polythiophene polymer, polysiloxane polymer, triphenylmethane polymer, triarylamine polymer and pyrazoline polymer. The conductive band formed by overlapping of the P electronic orbits within and between chains of the conducting polymer provides channels for transfer and transition of the carriers, so the composition has higher transmittance and carrier transfer rate, and in turn better conductive property, compared with the phosphorene.

The polythiophene polymer can comprise one or more of the following polymers: 3,4-ethylenedioxythiophene polymer, 3-hexylthiophene polymer, benzothiophene polymer, 2-chlorothiophene polymer, 3-methoxythiophene polymer and 2,3-dibromothiophene.

The polysiloxane polymer can comprise one or more of the following polymers: triethoxyvinylsilane polymer, vinyltriacetoxy-silane polymer, (γ-methacryloxy)propyltrimethoxysilane polymer, γ-chloropropyl triethoxysilane polymer.

The triphenylmethane polymer can comprise one or more of the following polymers: triaminotriphenyl emethane polymer or triphenylmethane polymer.

The triarylamine polymer can comprise one or more of the following polymers: N, N'-bis(3,5-dimethyl-phenyl)-N, N'-phenyl-1,1'-biphenyl-4,4'-diamine polymer, N,N,N,N-tetraphenylbenzidine polymer, 3-methyltriphenylamine polymer, 4-methyltriphenylamine polymer, 4,4'-dimethyltriphenylamine polymer.

The pyrazoline polymer can comprise one or more of the following polymers: 5-oxo-2-pyrazoline polymer, triphenylpyrazoline polymer, and 1,3-diphenyl-2-pyrazoline polymer.

In another embodiment of the disclosure, the mass fraction of the conducting polymer can be about 5%~10% with respect to the total mass of the conducting polymer, the curing material and the ionic liquid.

In another embodiment of the disclosure, with respect to the total mass of the conducting polymer, the curing material and the ionic liquid, the mass fraction of the curing material is about 0.5%~5%, preferably about 1.5%~3%. Besides, the curing material can comprise polymerisable resin and curing agent. The weight ratio of the polymerisable resin to the curing agent can be about 2000:1~10:1. The polymerisable resin can be at least one of the following: unsaturated polyester resin, phenolic resin and epoxy resin. The curing agent can be aliphatic amines, such as diethylenetriamine or dimethyl aminopropyl amine, and so on. The curing agent can also be aromatic amine, such as metaphenylene diamine or diaminodiphenyl methane, and so on.

In another embodiment of the disclosure, the ionic liquid can comprise water and at least one of the salts selected from the group of: 1-ethyl-3-methylimidazolium hexafluorophosphate ([EMIM] PF6 in short), 1-butyl-3-methylimidazolium hexafluorophosphate ([BMIM] PF6 in short), 1-octyl-3-methylimidazolium hexafluorophosphate ([OMIM] PF6 in short), 1-ethyl-3-methylimidazolium tetrafluoroborate ([EMIM] BF6 in short), 1-butyl-3-methylimidazolium trifluoromethanesulfonate ([BMIM] CF3S03 in short), 1-butyl-3-methylimidazolium chloride ([BMIM] Cl). With respect to the total mass of the ionic liquid, the mass fraction of the at least one of the salts is 10%~99%, preferably 30%~70%, more preferably 65%.

As an improvement embodiment of the disclosure, the composition used in the method for manufacturing a cathode of a solar unit can further comprises: wetting leveling agent. With respect to the total mass of the conducting polymer, the curing material and the ionic liquid, the mass fraction of the wetting leveling agent can be about 0.001%~1%, preferably about 0.2%. The adding of the wetting leveling agent endows the composition with a suitable surface tension and an ability of reducing the surface tension gradient, and then it is easier to form a flat, smooth and uniform film.

In practical use, the wetting leveling agent can comprise at least one of the following: organosiloxane wetting agent, fluorocarbon modified polyacrylate leveling agent, acrylic leveling agent.

As another improvement embodiment of the disclosure, the composition used in the method for manufacturing a cathode of a solar unit can further comprises adhesion promoter. With respect to the total mass of the conducting polymer, the curing material and the ionic liquid, mass fraction of the adhesion promoter can be about 0.001%~1%, preferably about 0.2%.

In practical use, the adhesion promoter can comprise at least one of the following: γ-(2,3-epoxypropoxy)propyl trimethoxy silane, β-(3,4-epoxy cyclohexane) ethyltrimethoxysilane, γ-aminopropyltriethoxysilane, long chain alkyl trimethoxysilane, vinyltriethoxysilane, vinyltrimethoxysilane, γ-chloropropyl triethoxysilane, bis-(γ-triethoxysilylpropyl)-tetrasulfide, anilino-methyl-triethoxysilane, N-β(aminoethyl)-γ-amino-propyltrimethoxysilane, N-(β-aminoethyl)-γ-aminopropyltriethoxysilane, N-β (aminoethyl)-γ-aminopropylmethyl-dimethoxysilane, γ-(2, 3-epoxypropoxy)propyltrimethoxysilane, γ-(methyl acryloyloxy)propyltrimethylsilane, γ-mercaptopropyltrimethoxysilane and γ-mercaptopropyltriethoxysilane.

In practical use, the condition for peeling off the photoresist can be about $10^{-5}$ torr; about 260±40° C., about 10~30 min, preferably about 260° C., about 20 min.

In a second aspect, the disclosure provides another method for manufacturing a cathode of a solar unit, comprising the following steps, step a) mixing a first curing material, a first ionic liquid and phosphorene homogeneously, to obtain a first mixture;

step b) coating the first mixture on the substrate, and then curing it to form a first film;

step c) applying photoresist on the first film corresponding to pixel areas by ink jet printing or applying photoresist on the first film corresponding to pixel areas by coating, and then carrying out the processes of exposure and development;

step d) etching the first film on which the photoresist has been ink jet printed or coated to form the cathode pattern of the solar unit;

step e) peeling off the photoresist;

step f) spraying the cathode pattern of the solar unit by using a second mixture comprising a first conducting polymer, a second curing material and a second ionic liquid, or immersing the cathode pattern of the solar unit in the second mixture;

step g) heating and curing it to form the cathode of the solar unit.

According to the another method for manufacturing a cathode of a solar unit, firstly forming the first film containing the phosphorene, and etching it to the cathode pattern of the solar unit, then using the second mixture to process the modification treatment to the cathode pattern of the solar unit, finally the obtained cathode of the solar unit not only has high stability, but also its carrier transfer rate can be increased, moreover has properties of high mechanical strength, good flexibility, low resistance value and long cell duration.

It should be noted that, in the step a) of the another method for manufacturing a cathode of a solar unit provided by the second aspect of the disclosure, as for the categories of the first curing material and the first ionic liquid, please refer to the description of the first aspect of the disclosure, it is unnecessary to go into details here. With respect to the total mass of the first curing material and the first ionic liquid, the mass fraction of the first curing material can be about 0.5%~5%.

Besides, with respect to the total mass of the first curing material and the first ionic liquid, the mass fraction of the phosphorene can be about 2%~10%.

In addition, the first mixture can further comprise at least one of the wetting leveling agent and the adhesion promoter. And with respect to the total mass of the first curing material and the first ionic liquid, the mass fraction of the wetting leveling agent can be about 0.001%~1%, preferably about 0.2%; with respect to the total mass of the first curing material and the first ionic liquid, the mass fraction of the adhesion promoter can be about 0.001%~1%, preferably about 0.2%. As for the categories of the wetting leveling agent and the adhesion promoter, please refer to the description of the first aspect of the disclosure. The adding of the wetting leveling agent can endow the first mixture with a suitable surface tension and an ability of reducing the surface tension gradient, and it is easier to form the first film flatly, smoothly and uniformly.

Furthermore, as for categories of the first conducting polymer, the second curing material and the second ionic liquid and their weight ratios to the sum thereof in the step f) of the another method of manufacturing a cathode of a solar unit provided by the second aspect of the disclosure, please refer to the description of the first aspect of the disclosure, it is unnecessary to go into details here. The second mixture can also comprise at least one of the wetting leveling agent and the adhesion promoter. As for categories of the wetting leveling agent and the adhesion promoter and their weight ratios to the sum of the first conducting polymer, the second curing material and the second ionic liquid, please refer to the description of the first aspect of the disclosure, it is unnecessary to go into details here. The adding of the adhesion promoter increases the adhesive force and bonding force of the second mixture to the pixel patterns after the photoresist is peeled off.

It should be further noted that, as for the manufacturing method of the first mixture in the step a) and the curing of the first mixture to form the first film in the step b) in the second aspect of the disclosure, please refer to the description of the first aspect of the disclosure, it is unnecessary to go into details here.

Besides, in the step g) of the second aspect of the disclosure, the time of immersing the cathode pattern of the solar unit in the second mixture can be about 30 s~200 s.

Furthermore, in the step g) of the second aspect of the disclosure, the conditions of the heating and curing specially can be: at the condition of about 220~300° C. and holding for about 60~120 s.

In addition, as for the conditions of peeling off the photoresist in the step e) of the another method for manufacturing a cathode of a solar unit provided by the second aspect of the disclosure, please refer to the description of the first aspect of the disclosure, it is unnecessary to go into details here.

In a third aspect, the disclosure provides further another method for manufacturing a cathode of a solar unit, which comprises the following steps, step a) mixing a third curing material, a third ionic liquid and phosphorene homogeneously, to obtain a third mixture;

step b) coating the third mixture on the substrate, and then curing it to form a second film;

step c, spraying the second film by using a fourth mixture comprising a second conducting polymer, a fourth curing material and a fourth ionic liquid, or immersing the second film in the fourth mixture;

step d) heating and curing it to form a third film;

step e) applying photoresist on the third film corresponding to pixel areas by ink jet printing, or applying photoresist on the third film corresponding to pixel areas by coating, then carrying out the processes of exposure and development;

step f) etching the third film on which the photoresist has been ink jet printed or coated to form the cathode pattern of the solar unit;

step g) peeling off the photoresist to obtain the cathode of the solar unit.

According to the further another method for manufacturing a cathode of a solar unit, firstly forming the second film containing the phosphorene, and then processing the modification treatment to the second film, so as to form a the third film with high stability. The cathode of the solar unit manufactured by the third film has all the advantages of that provided by the first aspect of the disclosure.

It should be noted that, as for the third curing material and the third ionic liquid in the step a) of the further another method for manufacturing a cathode of a solar unit provided by the third aspect of the disclosure, please refer to the description of the first aspect of the disclosure, it is unnecessary to go into details here. With respect to the total mass of the third curing material and the third ionic liquid, the mass fraction of the third curing material can be about 0.5%~5%.

In addition, with respect to the total mass of the third curing material and the third ionic liquid, the mass fraction of the phosphorene can be about 2%~10%.

Furthermore, the third mixture can also comprise at least one of the wetting leveling agent and the adhesion promoter. And with respect to the total mass of the third curing material and the third ionic liquid, the mass fraction of the wetting leveling agent can be about 0.001%~1%, preferably about 0.2%; with respect to the total mass of the third curing material and the third ionic liquid, the mass fraction of the adhesion promoter can be about 0.001%~1%, preferably about 0.2%. As for the categories of the wetting leveling agent and the adhesion promoter, please refer to the description of the first aspect of the disclosure. The adding of the wetting leveling agent makes the third mixture have a suitable surface tension and an ability of reducing the surface tension gradient, which makes it easier to form the second film being smooth and uniform.

Moreover, as for the categories of the second conducting polymer, the fourth curing material and the fourth ionic liquid and their weight ratios to the sum thereof in the step c) of the further another method for manufacturing a cathode of a solar unit provided by the third aspect of the disclosure, please refer to the description of the first aspect of the disclosure, it is unnecessary to go into details here. The fourth mixture can also comprise at least one of the wetting leveling agent and the adhesion promoter. As for the categories of the wetting leveling agent and the adhesion promoter and their weight ratios to the sum of the second conducting polymer, the fourth curing material and the fourth ionic liquid, please refer to the description of the first aspect of the disclosure. The adding of the adhesion promoter increases the adhesive force and bonding force of the fourth mixture to the pixel patterns after the photoresist is peeled off.

It should be further noted that, as for the manufacturing method of the third mixture in the step a) and the curing of the third mixture to form the second film in the step b) at the third aspect of the disclosure, please refer to the description of the first aspect of the disclosure.

Besides, as for the time of immersing the second film in the fourth mixture in the step c) of the third aspect of the disclosure, please refer to the description of the second aspect of the disclosure.

Furthermore, the conditions of the heating and curing in the step d) of the third aspect of the disclosure can specifically be at the condition of about 220~300° C. and curing for about 60~120 s.

In the practical use, the method for manufacturing a cathode of a solar unit can also comprise cleaning the substrate having the cathode pattern of the solar unit from which the photoresist is peeled off by using the deionized water.

In addition, as for the conditions of peeling off the photoresist in the step g) of the further another method for manufacturing a cathode of a solar unit provided by the third aspect of the disclosure, please refer to the description of the first aspect of the disclosure.

In a fourth aspect, the disclosure provides a cathode of a solar unit, which is manufactured by the method for manufacturing a cathode of a solar unit according to any one of the first to third aspect. The cathode of the solar unit has properties of high mechanical strength, good flexibility, high stability, low resistance value and high carrier transfer rate.

In a fifth aspect, the disclosure provides a solar unit, as shown in FIG. 1, which comprises a cathode 20, an anode 40, and a p-i-n layer 30 located between the cathode 20 and the anode 40, and the cathode 20 is that described according to the fourth aspect. The solar unit has properties of high mechanical strength, good flexibility, high stability, low resistance value and high carrier transfer rate. As for the anode and the p-i-n layer of the solar unit, the skills in the art can adopt anodes and p-i-n layers of the solar unit in the prior art, and it is unnecessary to go into details here. Wherein, the p-i-n layer comprises an n-type semiconductor layer 31, intrinsic semiconductor layer 32 (i.e. i-type semiconductor layer 32) and p-type semiconductor layer 33 in sequence from top to bottom. The anode can be made from indium tin oxide (ITO). The p-i-n layer can be made from p(ZnTe)/i(CdTe)/n(CdS).

In a sixth aspect, the disclosure provides a display device integrated with a solar unit, the solar unit of the display device is that described according to the fifth aspect.

In the practice use, as shown in FIG. 1, the display device integrated with the solar unit can comprise: a substrate 10; a solar unit provided by the fifth aspect of the disclosure arranged on the substrate 10; and a protective layer 50, that is OC (over coat) arranged on the solar unit. Wherein, the substrate preferably is a polyimide substrate with good flexibility. The display device has properties of high mechanical strength, good flexibility, low resistance value and long cell duration.

In a seventh aspect, the disclosure provides a composition for manufacturing the cathode of the solar unit, which is the composition used in the first aspect. As for the related contents of the composition, please refer to the description of the first aspect of the disclosure.

In an eighth aspect, the disclosure provides a film, which is the film formed in the step a) of the first aspect or the third film formed in the step d) of the third aspect. As for the forming procedures and conditions of the films, please refer to the related contents described in the first or third aspect of the disclosure.

At the ninth aspect, the disclosure further provides a cathode of solar unit, comprising a film which is formed by curing a composition, and a pixel electrode which is formed on the film; wherein the composition comprises conducting polymer, curing material, ionic liquid and phosphorene.

In a tenth aspect, the disclosure further provides a solar cell, comprising a cathode of solar unit mentioned above.

EXAMPLES

Materials and Instruments
1. Materials: The reagents used in the embodiments are all available in the market.
2. Instruments:
   Magnetic Stirrer, BRAND: IKA, MODEL: RCT
   Sheet Resistance Instrument, MANUFACTURER: Suzhou Jingge Electronic Co., LTD, MODEL: ST2253

Examples 1-5 Preparation of the Composition

Example 1

Weigh 2 g of the curing material precisely, and add it into 94 g of the ionic liquid, then heat the ionic liquid to 270° C. and stir the ionic liquid for 20 h at 200 r/min so as to make the curing material be completely dissolved, then cool the ionic liquid to the room temperature, then add 2 g of the poly(p-phenylenevinylene), 1 g of the 3,4-ethylenedioxythiophene polymer and 1 g of vinyltriethoxysilane into the ionic liquid, then stir the ionic liquid for 22 h at 200 r/min. After mixing them homogeneously, add 4 g of the phosphorene into the ionic liquid, then stir the ionic liquid for 24 h at 200 r/min so as that the phosphorene is dispersed homogeneously, and finally obtain the composition. Wherein, the ionic liquid is the solution containing of the 1-ethyl-3-methylimidazolium hexafluorophosphate, 1-butyl-3-methylimidazolium hexafluorophosphate, 1-octyl-3-methylimidazolium hexafluorophosphate and 1-ethyl-3-methylimidazolium tetrafluoroborate, the mass fraction thereof is 6%. The curing material is 1.8 g of the unsaturated polyester resin and 0.2 g of the aliphatic polyamine curing agent.

The preparation method and condition of Examples 2-5 is the same as that of Example 1, and only the components of the composition are different, as shown in table 1.

TABLE 1 the dosage of components of the composition prepared in Examples 2-5

| | Dosage of the phosphorene/g | Category and dosage of the conducting polymer/g | The curing material | | Category of the salt in the ionic liquid |
| --- | --- | --- | --- | --- | --- |
| | | | Category and dosage of the polymerizable resin/g | Category and dosage of the curing agent/g | |
| Example 2 | 3 | poly(p-phenylenevinylene) and polythiophene polymer: 9 | unsaturated polyester resin: 4.2 | aliphatic polyamine curing agent: 0.6 | 1-butyl-3-methylimidazolium hexafluorophosphate |
| Example 3 | 4.5 | polythiophene polymer: 8 | phenolic resin and epoxy resin: 3.8 | aliphatic polyamine curing agent: 0.5 | 1-butyl-3-methylimidazolium trifluoromethanesulfonate and 1-butyl-3-methylimidazolium chloride |
| Example 4 | 6 | polysiloxane polymer: 7 | unsaturated polyester resin: 2.5 | aliphatic polyamine curing agent: 0.35 | 1-butyl-3-methylimidazolium hexafluorophosphate |
| Example 5 | 8 | triarylamine polymer and pyrazoline polymer: 5.5 | phenolic resin: 1.0 | aliphatic polyamine curing agent: 0.15 | 1-butyl-3-methylimidazolium trifluoromethanesulfonate and 1-butyl-3-methylimidazolium chloride |

| | The mass fraction of the salt in the ionic liquid | Dosage of the ionic liquid/g | Category and dosage of the wetting leveling agent/g | Category and dosage of the adhesion promoter/g |
| --- | --- | --- | --- | --- |
| Example 2 | 85% | 94.2 | fluorocarbon modified polyacrylate leveling agent and acrylic leveling agent: 0.6 | γ-(2,3-epoxy propoxy) propyl trimethoxy silane,β-(3,4-epoxy cyclohexane) ethyl trimethoxysilane: 0.5 |
| Example 3 | 72% | 95.3 | organosiloxane wetting agent: 0.3 | vinyltrimethoxysilane, γ-chloropropyl triethoxysilane, bis-(γ-triethoxysilylpropyl)-tetrasulfide, anilino-methyl-triethoxysilane: 0.3 |
| Example 4 | 65% | 96.8 | fluorocarbon modified polyacrylate leveling agent: 0.2 | γ-(2,3-epoxy propoxy) propyl trimethoxy silane,β-(3,4-epoxy cyclohexane) ethyl trimethoxysilane, γ-aminopropyl triethoxysilane, long chain alkyl(dodecyl)-trimethoxysilane: 0.2 |

TABLE 1-continued the dosage of components of the composition prepared in Examples 2-5

| | | | | |
|---|---|---|---|---|
| Example 5 | 35% | 97.2 | organosiloxane wetting agent: 0.05 | γ-(2,3-epoxy propoxy) propyl trimethoxy silane,β-(3,4-epoxy cyclohexane) ethyl trimethoxysilane, γ-aminopropyl triethoxysilane, long chain alkyl(dodecyl)-trimethoxysilane: 0.05 |

Example 6 Preparation of the Film

Coat the composition prepared in Example 1 on the substrate, and cool it to room temperature, then the film is formed.

Example 7 Preparation of the Film

The preparation of the first mixture: adding 10 g of the phosphorene into the solution containing 2 g of the curing material and 88 g of the ionic liquid, then stirring the solution for 18 h at 150 r/min and mixing them homogeneously, obtaining the first mixture; wherein, the categories of the curing material and the categories and mass fraction of the salt in the ionic liquid are the same as those in Example 2;

The preparation of the second mixture: adding 3 g of the curing material into the ionic liquid of 89 g, and mixing them homogeneously; then adding 3 g of the poly(sodium-p-styrenesulfonate), 3 g of the triphenylpyrazoline polymer and 2 g of the 4-methyltriphenylamine into the ionic liquid, stirring the ionic liquid for 18 h at 150 r/min and mixing them homogeneously, then obtaining the second mixture; wherein, the categories of the curing material and the categories and mass fraction of the salt in the ionic liquid are the same as those in Example 2;

Coat the first mixture on a glass substrate, then cure it to form the first film;

Spray the second mixture on the first film, and maintain the substrate at the condition of 220° C. for 120 s, then cool it to room temperature and cure it to form the film;

Comparing to the film prepared in Example 6, the film prepared in Example 7 through the method of forming a protective layer on the surface of the phosphorene film has higher stability.

After taking a conductivity test to the first film and the film formed in Example 7, respectively, the results are as shown in table 2:

TABLE 2 results of the conductivity test of the first film and the film formed in Example 7

| | Sheet resistance Ω/□ | |
|---|---|---|
| Storage time | After modification treatment in Example 7 of the disclosure | No modification treatment |
| 0 h | 15 | 15 |
| 240 h | 15 | 496 |
| 480 h | 15 | 1850 |
| 960 h | 15 | 5305 |

It can be seen from the results of the table 2 that, through forming a protective layer on the surface of the first film, a film with stable conductive property can be obtained, which makes the cathode of the solar unit made from the film has stable conductive property, and in turn the solar unit has stable conductive property.

Comparative Example 1

Comparing to Example 1, the difference of the preparation of the composition lies only in: using the graphene instead of the phosphorene. The preparation of the film is the same as that of Example 6.

Comparative Example 2

Comparing to Example 1, the difference of the preparation of the composition lies only in: using the indium tin oxide instead of the phosphorene. The preparation of the film is the same as that of Example 6.

After taking a test to the film formed in Example 6 and that formed in Comparative Examples 1 & 2, the results are as shown in table 3.

TABLE 3 results of the comparative test between Example 6 and Comparative Examples 1 & 2

| | Film(nm) | Sheet resistance(Ω/□) | Elongation |
|---|---|---|---|
| Example 6 | 6 | 9 | 200 |
| Comparative Example 1 | 5 | 9.8 | 80 |
| Comparative Example 2 | 300 | 30 | 0 |

It can be seen from the table 3 that, under the same conditions, the film manufactured from the phosphorene has thickness being thinner and sheet resistance being lower than the films manufactured from the graphene and the indium tin oxide, that is, the resistance value is lower and the elongation is higher. In addition, the cost of the phosphorene is lower compared to the precious metal of indium tin oxide (ITO). Thus, it is known that the film manufactured from the phosphorene has better electric property and lower cost.

A further test is taken to the films obtained in Example 6 and Comparative Example 2, which is shown in table 4.

TABLE 4

Properties of the film obtained in Example 6 and Comparative Example 2

Figure 2:
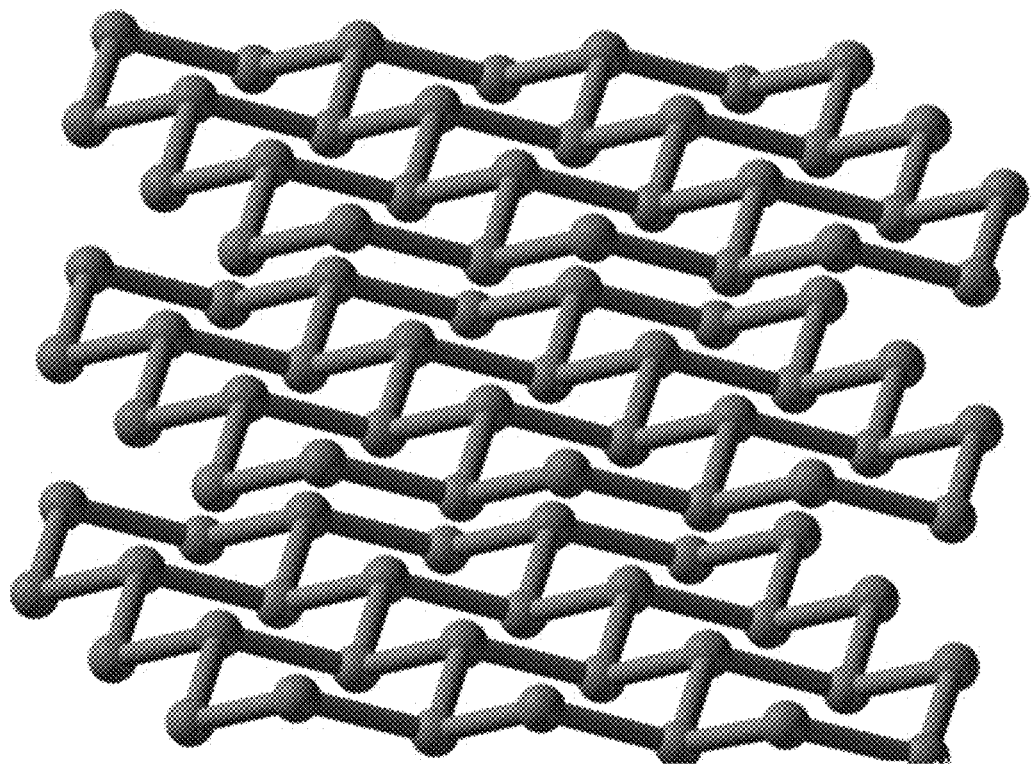
FIG. 2 is a schematic structural view of phosphorene.
Figure 3:
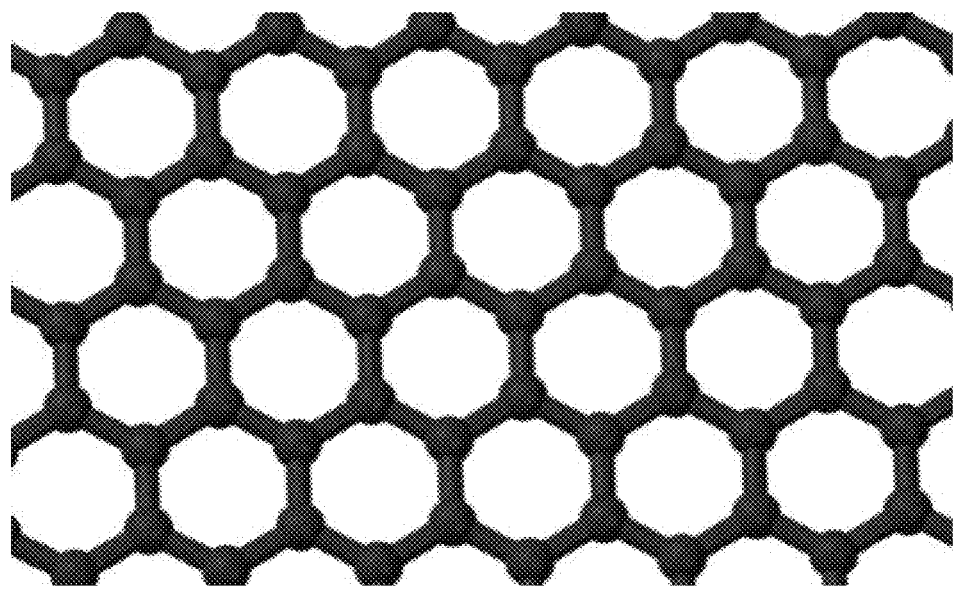
FIG. 3 is a schematic structural view of graphene.

| Property | Example 6 | Comparative Example 2 |
|---|---|---|
| Structure | The structure of the phosphorene in film being shown in FIG. 2: folded hexagon | The structure of the graphene in film being shown in FIG. 3: planar hexagon |

TABLE 4-continued

Properties of the film obtained in
Example 6 and Comparative Example 2

| | Property | Example 6 | Comparative Example 2 |
|---|---|---|---|
| Conductive property | Properties | Easy to turn on or off the current | leakage current appearing when switching the current |
| | Amount of leakage current | 0(equal to 0, i.e.: no leakage current) | $10^{-12}$(greater than 0) |
| Flexibility | Properties | High flexibility; compressibility due to the folded structure | High flexibility along the X-Y axis |
| | Elongation | Elongation in the Z direction being greater than 200 | Elongation in the Z direction being 0 |

It can be seen from the table 4 that, comparing to the graphene, the film of the disclosure manufactured from the phosphorene has better conductive property, no leakage current, better flexibility, bending property and compressibility. Thus, it is known that, the electrodes manufactured in the disclosure do not have the leakage current, and have good flexibility and better elongation.

Examples 8~10 Preparation of the Cathode of the Solar Unit

Example 8

Coat the polyimide liquid on the carrier glass, and maintain the polyimide liquid for 180 s at the condition of 200° C., then cure it to form the polyimide substrate;
Attach the film manufactured in Example 6 onto the polyimide substrate by aligning their positions, and maintain it for 90 s at the condition of 230° C.;
Coat the photoresist on the film manufactured in Example 6, and then carry out the processes of exposure and development;
Etch the film on which the photoresist has been coated to form the cathode pattern of the solar unit;
Peel off the photoresist after maintaining for 20 min at the condition of vacuum degree being 10-5 torr and 260° C.;
Clean the polyimide substrate by using the deionized water, and dry it, then peel off the polyimide substrate and the cathode of the solar unit from the glass substrate;

Example 9

Coat the polyimide liquid on the carrier glass, and maintain the polyimide liquid for 180 s at the condition of 200° C., then cure it to form the polyimide substrate;
Coat the first mixture prepared in Example 7 on the polyimide substrate, and cool the first mixture to room temperature and maintaining for 60 s, then obtain the first film;
Apply the photoresist on the first film corresponding to pixel areas by ink jet printing;
Etch the first film on which the photoresist has been coated to form the cathode pattern of the solar unit;
Peel off the photoresist after maintaining for 20 min at the condition of vacuum degree being 10-5 torr and 260° C.;
Clean the polyimide substrate by using the deionized water;
Spray the cathode pattern of the solar unit by using the second mixture prepared in Example 7;
Heat it to 220° C. and maintain for 120 s, then cure it to form the cathode of solar unit;
Peel off the polyimide substrate and the cathode of the solar unit from the glass substrate;

Example 10

Coat the polyimide liquid on the carrier glass, and maintain the polyimide liquid for 180 s at the condition of 200° C., then cure it to form the polyimide substrate;
Attach the film manufactured in Example 7 onto the polyimide substrate;
Coat the photoresist on the film manufactured in Example 7, and then carry out the processes of exposure and development;
Etch the film on which the photoresist has been coated to form the cathode pattern of the solar unit;
Peel off the photoresist after maintaining for 20 min at the condition of vacuum degree being 10-5 torr and 260° C.;
Clean the polyimide substrate by using the deionized water, and dry it, then peel off the polyimide substrate and the cathode of the solar unit from the glass substrate;

Comparative Example 3

The difference of the Comparative Example 3 from the Example 8 lies only in: using the graphene instead of the phosphorene, and others are completely the same.

Comparative Example 4

The difference of the Comparative Example 4 from the Example 9 lies only in: using the graphene instead of the phosphorene, and others are completely the same.

Comparative Example 5

The difference of the Comparative Example 5 from the Example 10 lies only in: using the graphene instead of the phosphorene, and others are completely the same.

The four-point bending test and the circuit state evaluation are taken to the polyimide substrate with the cathode of the solar unit of Examples 8~9 and Comparative Examples 3~5, respectively, under different pressure conditions. The results are as shown in table 5.

TABLE 5 comparing results between Examples 8~9 and Comparative Examples 3~5

| | | Example 8 | Example 9 | Example 10 | Comparative Example 3 | Comparative Example 4 | Comparative Example 5 |
|---|---|---|---|---|---|---|---|
| Mechanical strength | 1 atm * 2400 h | OK | OK | OK | OK | OK | OK |
| | 2 atm * 2400 h | OK | OK | OK | OK | NG | NG |

TABLE 5-continued comparing results between Examples 8~9 and Comparative Examples 3~5

|  | Example 8 | Example 9 | Example 10 | Comparative Example 3 | Comparative Example 4 | Comparative Example 5 |
|---|---|---|---|---|---|---|
| 3 atm * 2400 h | OK | OK | OK | NG | NG | NG |
| Validity (times) | >500,000 | >500,000 | >500,000 | 200,000 | 220,000 | 189,000 |

It can be seen from the table 5 that, the mechanical strength of the cathode of the solar unit provided by the disclosure is much higher than that of the cathode of the solar unit manufactured from the graphene. This is due to the superior elongation and mechanical strength property of the phosphorene which come from its physical structure of folded hexagon (as shown in FIG. 2). Due to the folded structure, a stacked structure in Z direction can occur in the phosphorene when it bears high stretching and pressure, and repeating bending. Furthermore, due to the stacked structure in the phosphorene, the electrodes which are not easy to break can be kept in the connected state. Then it will not result in a broken situation and being unable to conduct in the circuit. However, as for the graphene, whose physical structure of planar hexagon (as shown in FIG. 3) determines that it's lifetime is much shorter than the electrodes manufactured from the phosphorene of the disclosure, when it bears external forces such as high pressure and repeating bending.

It is known from the above Examples that, the cathode of the solar unit and the solar unit provided by the disclosure have properties of low cost, stable electric property, high conducting property, and good elongation in every direction, which can be used in flexible and wearing products and meet the requirements of cell duration to the wearing products.

The descriptions above are merely for good understanding of the technical solutions of the disclosure by the skilled in the art, and not to restrict the present disclosure. Various changes and modifications can be made without departing from the spirit and essence of the disclosure, which are also considered to be within the scope of the disclosure.

What is claimed is:

1. A method for manufacturing a cathode of a solar unit, comprising:
    curing a composition to form a film, wherein the composition comprises conducting polymer, curing material, ionic liquid and phosphorene;
    applying photoresist on the film corresponding to pixel areas by ink jet printing or applying photoresist on the film corresponding to pixel areas by coating, and then carrying out the processes of exposure and development;
    etching the film on which the photoresist has been ink jet printed or coated to form the cathode pattern of the solar unit; and
    peeling off the photoresist to obtain the cathode of the solar unit,
    wherein the weight ratio of the phosphorene to the sum of the conducting polymer, the curing material and the ionic liquid is about 2%~10%.

2. The method for manufacturing a cathode of a solar unit according to claim 1, wherein the conducting polymer comprises at least one of the polymers selected from the group consisting of: poly(sodiumstyrenesulfonate), poly(p-phenylenevinylene), polythiophene polymer, polysiloxane polymer, triphenylmethane polymer, triarylamine polymer and pyrazoline polymer.

3. The method for manufacturing a cathode of a solar unit according to claim 1, wherein the ionic liquid comprises water and at least one of the salt selected from the group consisting of: 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate and 1-butyl-3-methylimidazolium chloride;
    wherein the mass fraction of the at least one of the salt is about 10%~99% with respect to the total mass of the ionic liquid.

4. The method for manufacturing a cathode of a solar unit according to claim 1, wherein the mass fraction of the conducting polymer is about 5%~10% with respect to the total mass of the conducting polymer, the curing material and the ionic liquid.

5. The method for manufacturing a cathode of a solar unit according to claim 1, wherein the mass fraction of the curing material is 0.5%~5% with respect to the total mass of the conducting polymer, the curing material and the ionic liquid.

6. The method for manufacturing a cathode of a solar unit according to claim 1, wherein the composition further comprises: wetting leveling agent which mass fraction is about 0.001%~1% with respect to the total mass of the conducting polymer, the curing material and the ionic liquid; and/or adhesion promoter whose mass fraction is 0.001%~1% with respect to the total mass of the conducting polymer, the curing material and the ionic liquid.

7. A method for manufacturing a cathode of a solar unit, comprising:
    mixing a first curing material, a first ionic liquid and phosphorene homogeneously to obtain a first mixture;
    coating the first mixture on the substrate, and then curing it to form a first film layer;
    applying photoresist on the first film layer corresponding to pixel areas by ink jet printing or applying photoresist on the first film layer corresponding to pixel areas by coating, and then carrying out the processes of exposure and development;
    etching the first film layer on which the photoresist has been ink jet printed or coated to form the cathode pattern of the solar unit;
    peeling off the photoresist;
    spraying the cathode pattern of the solar unit by using a second mixture comprising a first conducting polymer, a second curing material and a second ionic liquid, or immersing the cathode pattern of the solar unit in the second mixture;
    heating and curing it to form the cathode of the solar unit.

8. A method for manufacturing a cathode of a solar unit according to claim 7, wherein the first curing material is the same as or is different from the second curing material.

9. A method for manufacturing a cathode of a solar unit according to claim 8, wherein the first curing material and the second curing material comprise polymerisable resin and curing agent, respectively.

10. A method for manufacturing a cathode of a solar unit according to claim 9, wherein the polymerisable resin is at least one of unsaturated polyester resin, phenolic resin and epoxy resin.

11. A method for manufacturing a cathode of a solar unit according to claim 9, wherein the curing agent is aliphatic amine curing agent or aromatic amine curing agent.

12. A method for manufacturing a cathode of a solar unit according to claim 7, wherein the first ionic liquid is the same as or is different from the second ionic liquid.

13. A method for manufacturing a cathode of a solar unit according to claim 7, wherein the first ionic liquid and the second ionic liquid respectively comprises water and at least one of the salt selected from the group consisting of: 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate and 1-butyl-3-methylimidazolium chloride.

14. A method for manufacturing a cathode of a solar unit according to claim 7, wherein the first conducting polymer comprises at least one of the polymers selected from the group consisting of: poly(sodiumstyrenesulfonate), poly(p-phenylenevinylene), polythiophene polymer, polysiloxane polymer, triphenylmethane polymer, triarylamine polymer and pyrazoline polymer.

* * * * *